United States Patent
Eichinger et al.

(10) Patent No.: US 9,450,602 B2
(45) Date of Patent: Sep. 20, 2016

(54) EFFICIENTLY QUERY COMPRESSED TIME-SERIES DATA IN A DATABASE

(71) Applicants: Frank Eichinger, Karlsruhe (DE); Dennis Kurfiss, Walldorf (DE)

(72) Inventors: Frank Eichinger, Karlsruhe (DE); Dennis Kurfiss, Walldorf (DE)

(73) Assignee: SAP SE, Palo Alto, CA (US)

( * ) Notice: Subject to any disclaimer, the term of this patent is extended or adjusted under 35 U.S.C. 154(b) by 186 days.

(21) Appl. No.: 14/146,589

(22) Filed: Jan. 2, 2014

(65) Prior Publication Data
US 2015/0186434 A1   Jul. 2, 2015

(51) Int. Cl.
*G06F 17/30* (2006.01)
*H03M 7/30* (2006.01)

(52) U.S. Cl.
CPC .......... *H03M 7/30* (2013.01); *G06F 17/30551* (2013.01); *H03M 7/3064* (2013.01)

(58) Field of Classification Search
CPC ................................................. G06F 17/30551
See application file for complete search history.

(56) References Cited

U.S. PATENT DOCUMENTS

| | | | |
|---|---|---|---|
| 5,093,782 A * | 3/1992 | Muraski | G06F 17/30575 |
| 8,742,959 B1 | 6/2014 | Efros et al. | |
| 2004/0015478 A1 * | 1/2004 | Pauly | G06F 17/30327 |
| 2007/0208792 A1 * | 9/2007 | Berjon | G06T 9/001 708/207 |
| 2013/0103657 A1 * | 4/2013 | Ikawa | G06F 17/30321 707/693 |
| 2014/0122022 A1 * | 5/2014 | Chen | G06F 3/06 702/181 |

OTHER PUBLICATIONS

Zhang et al., A Self-Adaptive Regression-Based Multivariate Data Compression Scheme with Error Bound in Wireless Sensor Networks, 2013, Hindawi, vol. 2013, pp. 1-12.*

* cited by examiner

*Primary Examiner* — Etienne Leroux
*Assistant Examiner* — Dara J Glasser
(74) *Attorney, Agent, or Firm* — Mintz Levin Cohn Ferris Glovsky and Popeo, P.C.

(57) ABSTRACT

A query of time series data stored in a database is received that specifies at least one value. The database includes (i) an index table specifying groups of segments of compressed time series data with corresponding ranges each having a lowest value and a highest value, and (ii) a segments table specifying individual segments of compressed time series data. Thereafter, using the index table, at least one group for which the specified at least one value falls within the corresponding range is identified. The segments table is then queried for the segments corresponding to the identified at least one group to generate a new segments table specifying at least one segment. Next, the at least one segment specified by the new segments table is decompressed. Data responsive to the query within the decompressed at least one segment is then identified using the specified at least one value.

20 Claims, 2 Drawing Sheets

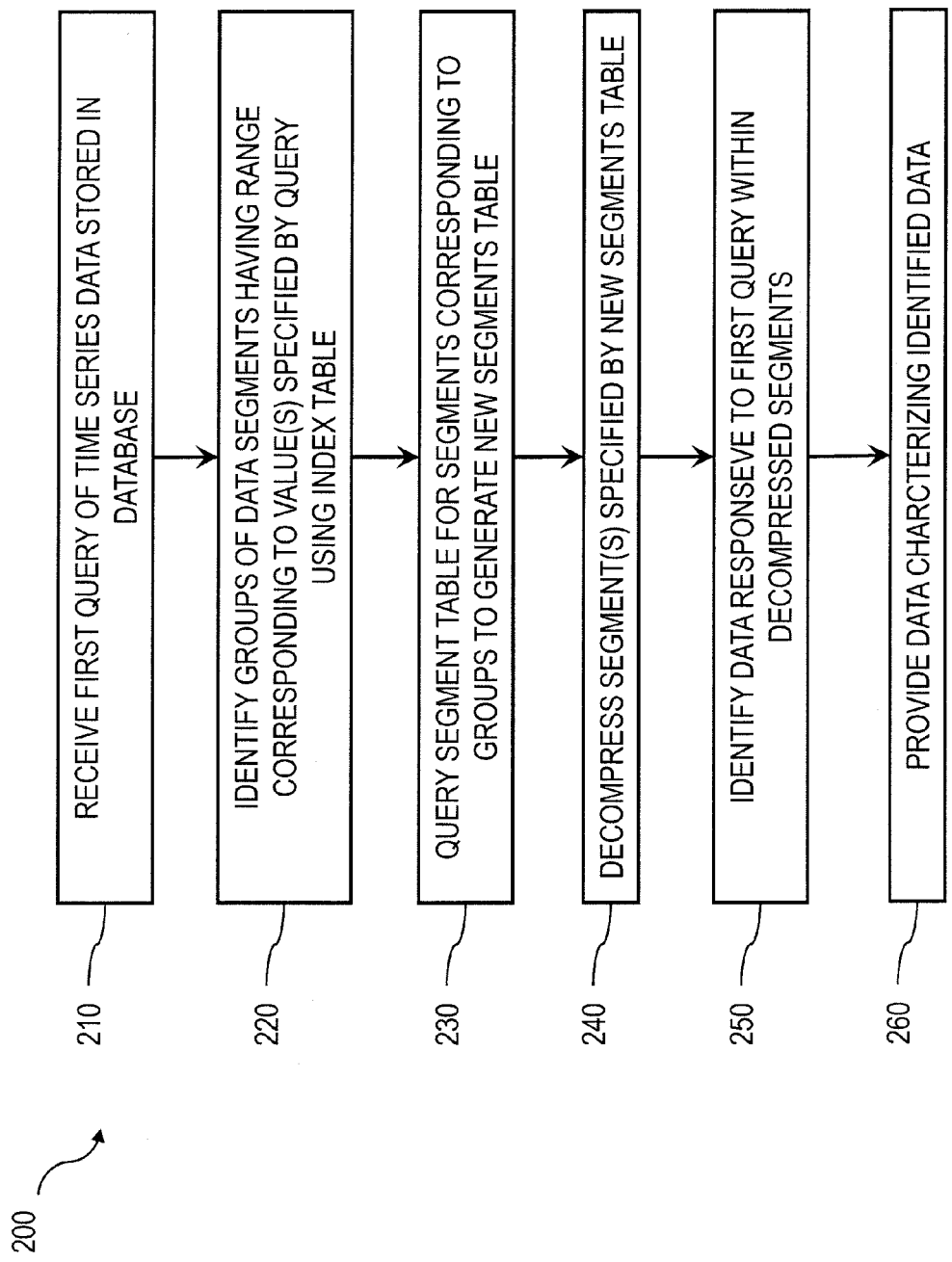

EFFICIENTLY QUERY COMPRESSED TIME-SERIES DATA IN A DATABASE

TECHNICAL FIELD

The subject matter described herein relates to techniques for querying compressed time-series data in a database.

BACKGROUND

Billions of devices will soon be interconnected while monitoring and controlling the physical infrastructure as well as other technical and natural objects. Such devices generate large amounts of information, often as time-series data. These devices include smart electricity meters and all kinds of sensors capturing data from the physical world, including industrial processes. To make use of such data, for example, in analytical applications, the data needs to be stored in databases. As storing huge amounts of information is extremely expensive—and in certain situations not feasible because of its size—data compression can be used to reduce the size of the data by, say, several hundred times.

SUMMARY

In one aspect, a query of time series data stored in a database is received that specifies at least one value. The database includes (i) an index table specifying groups of segments of compressed time series data with corresponding ranges each having a lowest value and a highest value, and (ii) a segments table specifying individual segments of compressed time series data. Thereafter, using the index table, at least one group for which the specified at least one value falls within the corresponding range is identified. The segments table is then queried for the segments corresponding to the identified at least one group to generate a new segments table specifying at least one segment. Next, the at least one segment specified by the new segments table is decompressed. Data responsive to the query within the decompressed at least one segment is then identified using the specified at least one value. Data characterizing the identified data responsive to the query is then provided.

At least one of the receiving, identifying, querying, decompressing, identifying, and providing can be implemented by at least one data processor of at least one computing system. Providing data can include at least one of: displaying the data, loading the data into memory, transmitting the data to a remote computing system, and storing the data in a data store.

The index table can be also generated, and it can be generated using a segments parameter that specifies a number of segments to be specified by a single group of segments and/or a time span to be covered by a single group of segments.

The data can be compressed using piecewise regression-based compression. The segments table can specify a decompression function and decompression parameters for decompressing each segment.

The database can include an in-memory database management system storing data in volatile memory database. The in-memory database management system can be a column-oriented database management system storing data as sections of columns. The current subject matter is also applicable to row oriented databases as well as databases that do not operate in-memory.

The specified at least one value can include a predicate or ordering, wherein identifying data responsive to the query within the decompressed at least one segment using the specified at least one value further comprises applying the predicate or ordering to the decompressed at least one segment.

In some variations, if it determined that there are no groups for which the specified at least one value falls within the corresponding range, segments of the segments table can be decompressed until data responsive to the query is identified.

Other variations can be employed in which it is not necessary to store the minimum and the maximum values explicitly (the corresponding columns can be removed from the tables in the internal data organization) nor are index tables required. For example, if segments are compressed with constant functions, the parameter of the function can represent the minimum and the maximum of the function (which allows the pre-selection to be based on a corresponding param_1 alone). In case the compression algorithm employs only linear functions (and possibly additionally constant functions, as they can be converted to linear ones), the starting and ending points of a linear function in an interval can represent the minimum and the maximum value of the interval. Using a distinction of cases, it is possible to pre-select the segments based on the values val_min and val_max. In addition, if the compression algorithm employs only functions for which the extrema can be computed efficiently, the extrema for the pre-selection of the segments can be computed on-the-fly when answering a query instead of storing the maximum and minimum explicitly.

Non-transitory computer program products (i.e., physically embodied computer program products) are also described that store instructions, which when executed one or more data processors of one or more computing systems, causes at least one data processor to perform operations herein. Similarly, computer systems are also described that may include one or more data processors and memory coupled to the one or more data processors. The memory may temporarily or permanently store instructions that cause at least one processor to perform one or more of the operations described herein. In addition, methods can be implemented by one or more data processors either within a single computing system or distributed among two or more computing systems. Such computing systems can be connected and can exchange data and/or commands or other instructions or the like via one or more connections, including but not limited to a connection over a network (e.g. the Internet, a wireless wide area network, a local area network, a wide area network, a wired network, or the like), via a direct connection between one or more of the multiple computing systems, etc.

The subject matter described herein provides many advantages. For example, the current subject matter enables database systems to not only store time-series data in a space-efficient way, but also to deal with queries of time-series data in an efficient manner while only marginally decreasing compression ratios. Such advances allow for applications to be generated that rely on fine-grained time-series data.

The details of one or more variations of the subject matter described herein are set forth in the accompanying drawings and the description below. Other features and advantages of the subject matter described herein will be apparent from the description and drawings, and from the claims.

DESCRIPTION OF DRAWINGS

FIG. 2 is a process flow diagram illustrating a method for querying time-series data stored in a database.

DETAILED DESCRIPTION

Figure 1:
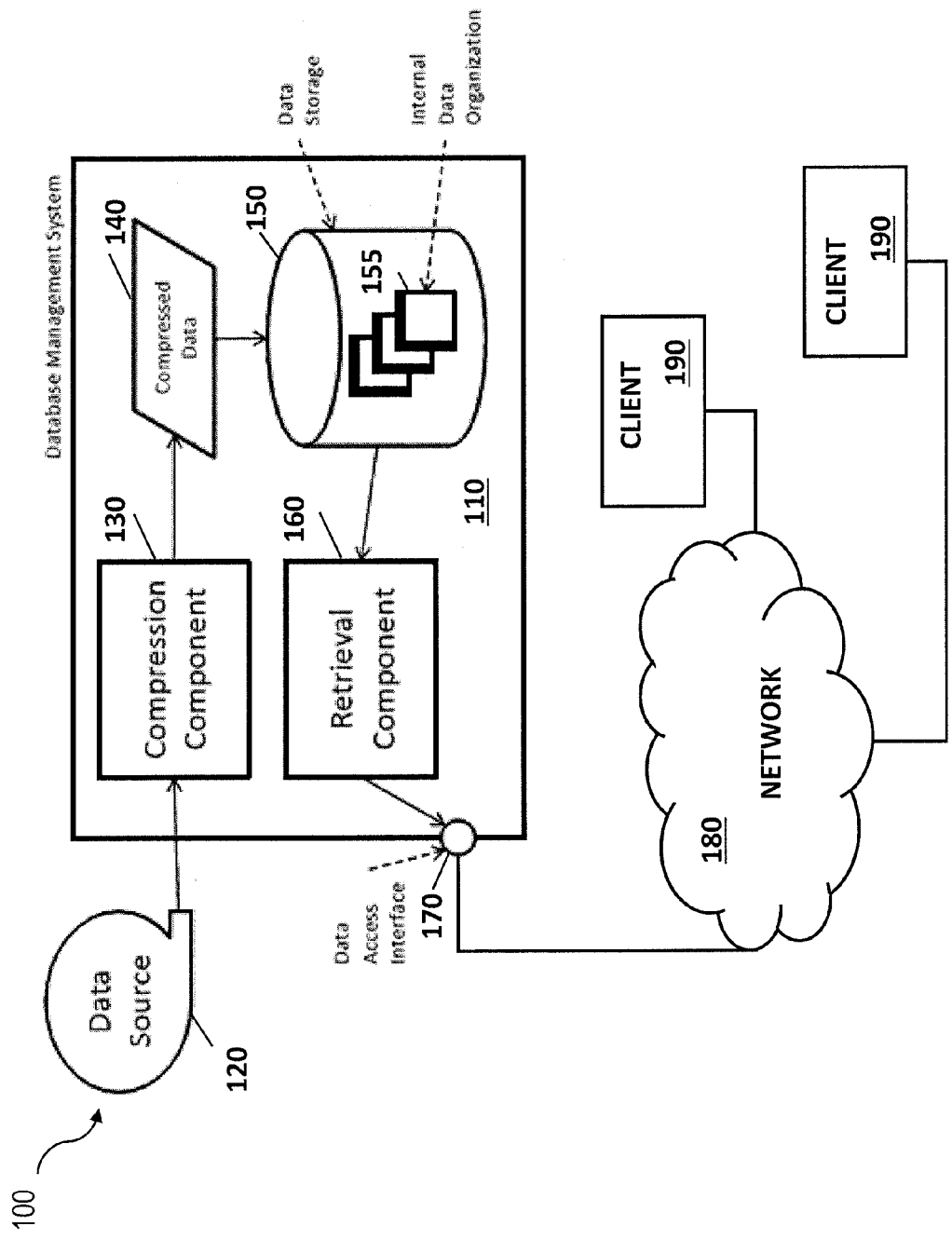
FIG. 1 is a system diagram illustrating an architecture for querying time-series data stored in a database.

To facilitate the compressed storage of time-series data, piecewise-regression-based compression can be used (such as described in U.S. patent application Ser. No. 13/746,802, entitled "Compressing a Time Series of Data", the contents of which are hereby fully incorporated by reference). Such techniques can be integrated seamlessly in database-management systems including traditional relational database management systems. These techniques are also well suited for integration into in-memory database technology and column-stores such as the SAP HANA platform. While piecewise-regression-based compression can lead to high compression ratios and can compress/store and decompress/retrieve (parts of) time series in a very fast way, it can be difficult to answer so-called value-based queries in an efficient way while keeping high compression ratios. An example of such a query is "select all time-series exceeding threshold x". As such queries are very important in many domains, for example, in surveillance of sensor data, the usage of promising piecewise-regression-based compression techniques is currently limited.

The current subject matter provides efficient processing of value-based queries in time-series data in database systems compressed by various compression techniques including, but not limited to, piecewise-regression-based compression.

Compressed Time-Series Data in Database Tables. Table 1 illustrates how piecewise-regression-based compression stores compressed time series using a particular example representation. It will be appreciated that different algorithms and implementations can utilize different database schemata.

TABLE 1

Database table 'segments' with example data, where function id 2 stands for a parabolic function and function id 1 stands for a linear function.

| segments | ts_id | t_start | t_end | function_id | function_params |
|---|---|---|---|---|---|
| | 1 | 2013-06-12 10:02:33 | 2013-06-12 10:07:41 | 2 | 12.33, 21.84, 2.73 |
| | 1 | 2013-06-12 10:07:42 | 2013-06-12 10:33:14 | 1 | 24.33, 7.74 |

Table 1 is an example table called 'segments' storing compressed time series. Concretely, the table can store multiple time series identified by their ts_id. Each row of the table can stand for one segment (or interval) of a time series that is compressed by a regression function. The segment can be defined by its start and end points t_start and t_end. function_id can be the id of a function used to compress the segment (an arbitrary regression function may be chosen by the compression algorithm) and function_params can be the parameters of the function mentioned.

The example data in Table 1 describes a time series having the ts_id 1. The first segment starts at 2013-06-12 10:02:33 and is described by a parabolic regression function (function_id 2). This function type requires three function params. The second segment starts one second after the end of the first segment and is described by a linear function requiring two parameters.

Decompressing Time-Series Data in Databases. When piecewise-regression-based compression is implemented in a database, the segments table (Table 1) can be used internally and be hidden from the user. User in this device can refer to a person, a software application, and/or a service. From the user point of view, querying a time-series table having a design as in Table 2 can be preferred. Table 2 is an example for the first two decompressed values from the time series in Table 1. Likewise, a table like Table 2 was the original source for obtaining the compressed segments table Table 1 using a compression algorithm.

TABLE 2

Database table 'timeseries' with example data.

| timeseries | ts_id | time | value |
|---|---|---|---|
| | 1 | 2013-06-12 10:02:33 | 12.33 |
| | 1 | 2013-06-12 10:02:34 | 12.41 |

If a user wants to display a time series, the user can send a query and a retrieval component within the database management system can internally translate a compressed table to an uncompressed table. Concretely, the user query can be as follows:

Q1 SELECT*FROM timeseries WHERE ts_id=1
AND time >=2013-06-12 00:00:00 AND time <=2013-06-12 23:59:59;

The user can then expect a result table such as Table 2 (but with one row for each second of 2013-06-12). To obtain this result, the retrieval component can decompress the segments table. It does so by calculating the function values from the regression function employed for compressing the respective segments for every point in the requested time frame (in this example for every second).

In an example implementation in SAP HANA, SQLScript language (the procedural database language in SAP HANA) can be used to perform the decompression. SAP HANA is an in-memory database management system storing data in a columnar fashion. In this scenario, the user can call a decompression procedure to decompress a compressed time series and to provide it in a time-series database table. Other database languages such as PL/SQL can be used in other database management systems, and the functionality can also be natively integrated into the database. In the latter case, there would be no need for explicit calls of decompression procedures, and the user can access the time-series table transparently without knowing that internally some decompression takes place. Regardless of the database management system, the calculations described above can be executed extremely fast inside the database.

Value-Based Queries on Compressed Time-Series Data. In contrast with regular database queries such as the query referenced above (Q1) which might have predicates on the time or the time-series id, value-based queries have (additional) predicates or ordering instructions such as "ORDER BY" (including corresponding TOP or RANK clauses) on the values of the time series. The following is an example of such a query:

Q2 SELECT*FROM timeseries WHERE value >90
AND time >=2013-03-12 00:00:00 AND time <=2013-
06-12 23:59:59;

In this example, the user queries all time series within the past three months where the value exceeds a threshold of 90. One example is a surveillance application of industrial devices for which exceeding a temperature of 90° C. for a longer period is dangerous. Note that value >90 is only one example for value-based queries. Such queries may include all types of predicates or ordering instructions based on the value attribute of a time series.

For answering the example query Q2, it is possible to apply the naïve approach to first decompress all time series data in the respective time frame and to succinctly query all entries with a value >90. However, as a database may contain thousands of time series, this would be very expensive in terms of resource consumption and possibly prohibitive. As will be described below an index table can be provided that allows for pre-selection of segments which need to be decompressed in order to answer the query efficiently.

Architecture of a Deployment in a Database Management System. FIG. 1 is a diagram 100 that visualizes the architecture of a deployment within a relational database-management system 110 (sometimes referred to simply as a database). An external data source 120 (such as a sensor or a smart electricity meter) can provide time-series data to be compressed and loaded into the database 110. A compression component 130, that can form part of the database 110, can compress data received from the external data source 120 using, for example, techniques references above to result in compressed data 140. The compressed data 140 can then be stored in data storage 150 of the database 110. The data storage 150 can store data according to a particular internal data organization 155 such as the segments tables described above. A retrieval component 160 can have access to the data storage 150 that can decompress data stored therein as described above. Finally, external applications can access the retrieval component 160 via a data access interface 170. The data access interface 170 can, for example, provide direct access to the database-management system using general purpose (e.g., SQL) or it can comprise other customized interfaces. The external applications can execute on a remote client computer 190 that accesses the database 110 over a network 180 via the data access interface 170.

The internal data organization 155 of the database 110 can comprise an index table 'indextab' that is in addition to segments table described above. The index table can store meta information for several segments (e.g., groups of segments, etc.) in aggregated values.

TABLE 3

Database table 'indextab' with example data.

| indextab | ts_id | t_start | t_end | minimum | maximum |
|---|---|---|---|---|---|
|  | 1 | 2013-06-12 09:12:53 | 2013-06-12 14:22:28 | 12.33 | 43.94 |

Table 3 is an example of an 'indextab' table. This example includes only one entry for a time period of slightly more than five hours. The minimum and maximum values indicate the lowest and highest value occurring in the original time series (consisting of several segments in the segments table) in the time frame specified. When processing value-based queries, a query can be first executed on the index table. The result, in most cases, can help dramatically limit the number of segments that require decompression.

Usage of Further Index Structures. As the table 'indextab' is stored in a database management system, traditional index structures such as B+ trees on the minimum and maximum columns can be used to further speed-up access times. This needs to be chosen depending on the actual database technology (e.g., in in-memory column-store databases such as SAP HANA, additional indices may not be necessary as the column-store technology already acts as an index), and existing (auto-)tuning mechanisms may be used.

Control of the Number of Entries in 'indextab' Tables. With the examples above, the entries in an 'indextab' table can stand for a couple of segments (groups, etc.) in the 'segments' table. Determining the ratio of such entries to segments is an important trade-off: Too many entries reduce the compression ratio and too few entries lead to longer execution times. Controlling this trade-off is done by a user-defined parameter #segments which controls the number of segments to be covered by one entry in 'indextab'. Alternatively, a parameter #entries per million can be used, which controls the number of entries which should be used to cover one million steps of a time series (e.g., one million seconds if the time series describes measurements every second).

Creation of the 'indextab' Tables in the Compression Component. The 'indextab' tables can be generated by the compression component 130 while compressing a time series. The 'indextab' can use the original values of the time series to determine the maximum and minimum value for each entry in 'indextab'.

Retrieval Component. The following provides examples of how the retrieval component 160 operates. To continue the example with temperature values exceeding 90° C. (Q2), looking at Table 3 indicates that there are no values bigger than 43.94, and the query can be terminated by returning an empty set—without doing any decompression at all. Concretely, the example query Q2 would be first translated to a query on the index table:

Q3 SELECT ts_id, t_start, t_end FROM indextab
WHERE maximum >90
AND time >=2013-03-12 00:00:00 AND time <=2013-
06-12 23:59:59;

As mentioned above, in this example, the result of this query is an empty set. This indicates to the retrieval component 160 to likewise return an empty set.

In a further example, tables can be populated with many more values. Assume that the result from the last query (Q3) is not empty, but as given in Table 4.

TABLE 4

Example result table.

| ts_id | time | Value |
|---|---|---|
| 12 | 2013-03-15 11:43:25 | 2013-03-17 08:47:56 |
| 4 | 2013-03-17 04:21:42 | 2013-03-22 14:04:16 |
| 234 | 2013-04-28 01:00:28 | 2013-05-02 19:22:47 |

The result from Table 4 can then be used to automatically assemble a query on the segments table (assume the existence of a table structured like Table 1, but containing millions of entries):

Q4 SELECT * FROM segments WHERE (1 = 2
OR (ts_idts_id = 12

-continued

| | |
|---|---|
| AND time >= 08:47:56) | 2013-03-15 11:43:25 AND time <= 2013-03-17 |
| OR (ts_id = | 4 |
| AND time >= 14:04:16) | 2013-03-17 04:21:42 AND time <= 2013-03-22 |
| OR (ts_id = | 234 |
| AND time >= 19:22:47) ); | 2013-04-28 01:00:28 AND time <= 2013-05-02 |

Note that this query (Q4) is an example how the result given in Table 4 is translated to a new query. The result from this query (Q4) is a new segments table (structured like Table 1) with a comparably very low number of entries. This new segments table can then be passed to the decompressing functionality that decompresses compressed time series (as described previously) and the predicate value >90 can be applied to the result in order to obtain the final result of the query which is passed via the data access interface 170 to the user (note that different predicates may be used in other value-based queries).

Similarly, it is possible to select segments which are relevant for answering Top-K Queries very efficiently on the 'indextab' to reduce the amount of data for decompression.

FIG. 2 is a process flow diagram 200 in which, at 210, a query of time series data stored in a database is received that specifies at least one value. The database includes an index table specifying groups of segments of compressed time series data with corresponding ranges each having a lowest value and a highest value, and a segments table specifying individual segments of compressed time series data. Thereafter, at 220, at least one group for which the specified at least one value falls within the corresponding range is identified using the index table. Next, at 230, the segment table is queried for the segments corresponding to the identified at least one group to generate a new segments table specifying at least one segment. The at least one segment specified by the new segments table is then, at 240, decompressed. Data responsive to the query is then identified, at 250, using the value so that, at 260, data characterizing the identified data responsive to the query can be provided (e.g., displayed, loaded, stored, transmitted to a remote computing system, etc.). In some cases, the query can specify a predicate to further filter the results among the decompressed data.

In case that the compression algorithm (as described above) employs functions fulfilling certain criteria, implementations alternative to the index-table approach can be used. Such alternatives can be beneficial as they do not require metadata and, thus, require less storage space. Three alternatives are described below. In all three alternatives, it is not necessary to store the minimum and the maximum values explicitly (the corresponding columns can be removed from the tables in the internal data organization) nor are index tables required.

A first alternative is segments that are compressed with constant functions. If a segment is approximated with a constant function, the parameter of the function represents already the minimum and the maximum of the function. In case the compression algorithm employs only constant functions, it is therefore possible to do the pre-selection based on param_1 alone. A second alternative can be used with segments that are compressed with linear functions. In case the compression algorithm employs only linear functions (and possibly additionally constant functions, as they can be converted to linear ones), the following variation can provide a favorable alternative: Instead of the two params of the linear function, the value of the first (val_start) and the last approximated value (val_end) of a segment are stored. Together with the values t_start and t_end, the values val_start and val_end represent two points. These two points likewise define the linear function. The nature of the starting and the ending point of a linear function in an interval is that they represent the minimum and the maximum value of the interval. However, it is not clear which of the values is the maximum and which is the minimum. Using a distinction of cases, it is possible to pre-select the segments based on the values val_min and val_max.

A third technique can be used with segments that are compressed with functions with the possibility of efficient computation of the extrema. In case the compression algorithm employs only functions for which the extrema can be computed efficiently, the extrema for the pre-selection of the segments can be computed on-the-fly when answering a query instead of storing the maximum and minimum explicitly. This additionally requires very fast computation and a moderate number of segments. In this alternative, it may be faster to compute the extrema at runtime of the query (and possibly cache them for future use in temporary tables) than to decompress more segments, caused by using the index table.

One or more aspects or features of the subject matter described herein may be realized in digital electronic circuitry, integrated circuitry, specially designed ASICs (application specific integrated circuits), computer hardware, firmware, software, and/or combinations thereof. These various implementations may include implementation in one or more computer programs that are executable and/or interpretable on a programmable system including at least one programmable processor, which may be special or general purpose, coupled to receive data and instructions from, and to transmit data and instructions to, a storage system, at least one input device (e.g., mouse, touch screen, etc.), and at least one output device.

These computer programs, which can also be referred to as programs, software, software applications, applications, components, or code, include machine instructions for a programmable processor, and can be implemented in a high-level procedural language, an object-oriented programming language, a functional programming language, a logical programming language, and/or in assembly/machine language. As used herein, the term "machine-readable medium" (sometimes referred to as a computer program product) refers to physically embodied apparatus and/or device, such as for example magnetic discs, optical disks, memory, and Programmable Logic Devices (PLDs), used to provide machine instructions and/or data to a programmable data processor, including a machine-readable medium that receives machine instructions as a machine-readable signal. The term "machine-readable signal" refers to any signal used to provide machine instructions and/or data to a programmable data processor. The machine-readable medium can store such machine instructions non-transitorily, such as for example as would a non-transient solid state memory or a magnetic hard drive or any equivalent storage medium. The machine-readable medium can alternatively or additionally store such machine instructions in a transient manner, such as for example as would a processor cache or other random access memory associated with one or more physical processor cores.

To provide for interaction with a user, the subject matter described herein can be implemented on a computer having a display device, such as for example a cathode ray tube (CRT) or a liquid crystal display (LCD) monitor for displaying information to the user and a keyboard and a pointing device, such as for example a mouse or a trackball, by which the user may provide input to the computer. Other kinds of devices can be used to provide for interaction with a user as well. For example, feedback provided to the user can be any form of sensory feedback, such as for example visual feedback, auditory feedback, or tactile feedback; and input from the user may be received in any form, including, but not limited to, acoustic, speech, or tactile input. Other possible input devices include, but are not limited to, touch screens or other touch-sensitive devices such as single or multi-point resistive or capacitive trackpads, voice recognition hardware and software, optical scanners, optical pointers, digital image capture devices and associated interpretation software, and the like.

The subject matter described herein may be implemented in a computing system that includes a back-end component (e.g., as a data server), or that includes a middleware component (e.g., an application server), or that includes a front-end component (e.g., a client computer having a graphical user interface or a Web browser through which a user may interact with an implementation of the subject matter described herein), or any combination of such back-end, middleware, or front-end components. The components of the system may be interconnected by any form or medium of digital data communication (e.g., a communication network). Examples of communication networks include a local area network ("LAN"), a wide area network ("WAN"), and the Internet.

The computing system may include clients and servers. A client and server are generally remote from each other and typically interact through a communication network. The relationship of client and server arises by virtue of computer programs running on the respective computers and having a client-server relationship to each other.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flow(s) depicted in the accompanying figures and/or described herein do not necessarily require the particular order shown, or sequential order, to achieve desirable results. Other implementations may be within the scope of the following claims.

What is claimed is:

1. A computer-implemented method comprising:
receiving a query of time series data stored in a database that specifies at least one value, the database comprising (i) an index table specifying groups of segments of compressed time series data with corresponding ranges each having a lowest value and a highest value, and (ii) a segments table specifying individual segments of compressed time series data, wherein the segments table specifies a decompression function and decompression parameters for decompressing each segment;
identifying, using the index table, at least one group for which the specified at least one value falls within the corresponding range;
querying the segments table for the segments corresponding to the identified at least one group to generate a new segments table including at least one segment;
decompressing the at least one segment specified by the new segments table; and
computing, at runtime of the query, a lowest value and a highest value of another segment specified by the segments table, the other segment not being specified by the index table;
identifying data responsive to the query within the decompressed at least one segment using the specified at least one value; and
providing data characterizing the identified data responsive to the query.

2. A method as in claim 1, wherein at least one of the receiving, identifying, querying, decompressing, identifying, and providing is implemented by at least one data processor forming part of at least one computing system.

3. A method as in claim 1, wherein the providing data comprises at least one of: displaying the data, loading the data into memory, transmitting the data to a remote computing system, and storing the data in a data store.

4. A method as in claim 1, further comprising:
generating the index table.

5. A method as in claim 4, wherein the index table is generated using a segments parameter that specifies a number of segments to be specified by a single group of segments and/or a time span to be covered by a single group of segments.

6. A method as in claim 1, wherein the data is compressed using piecewise regression-based compression.

7. A method as in claim 1, wherein the database comprises an in-memory database management system storing data in volatile memory database.

8. A method as in claim 7, wherein the in-memory database management system comprises a column-oriented database management system storing data as sections of columns.

9. A method as in claim 1, wherein the specified at least one value comprises a predicate or ordering, wherein identifying data responsive to the query within the decompressed at least one segment using the specified at least one value further comprises applying the predicate or ordering to the decompressed at least one segment.

10. A non-transitory computer program product storing instructions which, when executed by at least one data processor forming part of at least one computing system, result in operations comprising:
receiving a query of time series data stored in a database that specifies at least one value, the database comprising (i) an index table specifying groups of segments of compressed time series data with corresponding ranges each having a lowest value and a highest value, and (ii) a segments table specifying individual segments of compressed time series data, wherein the segments table specifies a decompression function and decompression parameters for decompressing each segment;
identifying, using the index table, at least one group for which the specified at least one value falls within the corresponding range;
querying the segments table for the segments corresponding to the identified at least one group to generate a new segments table including at least one segment;

decompressing the at least one segment specified by the new segments table; and computing, at runtime of the query, a lowest value and a highest value of another segment specified by the segments table, the other segment not being specified by the index table;

identifying data responsive to the query within the decompressed at least one segment using the specified at least one value; and providing data characterizing the identified data responsive to the query.

11. A computer program product as in claim 1, wherein the operations further comprise:

generating the index table.

12. A computer program product as in claim 11, wherein the index table is generated using a segments parameter that specifies a number of segments to be specified by a single group of segments and/or a time span to be covered by a single group of segments.

13. A computer program product as in claim 10, wherein the data is compressed using piecewise regression-based compression.

14. A computer program product as in claim 10, wherein the database comprises an in-memory database management system storing data in volatile memory database.

15. A computer program product as in claim 14, wherein the in-memory database management system comprises a column-oriented database management system storing data as sections of columns.

16. A computer program product as in claim 10, wherein the specified at least one value comprises a predicate or ordering, wherein identifying data responsive to the query within the decompressed at least one segment using the specified at least one value further comprises applying the predicate or ordering to the decompressed at least one segment.

17. A computer-implemented method comprising:

receiving a query of time series data stored in a database that specifies at least one value, the database comprising (i) an index table specifying groups of segments of compressed time series data with corresponding ranges each having a lowest value and a highest value, and (ii) a segments table specifying individual segments of compressed time series data, wherein the segments table specifies a decompression function and decompression parameters for decompressing each segment;

determining, using the index table, whether there is at least one group for which the specified at least one value falls within the corresponding range;

if it determined that there is at least one group for which the specified at least one value falls within the corresponding range:

querying the segments table for the segments corresponding to the identified at least one group to generate a new segments table including at least one segment, decompressing the at least one segment specified by the new segments table, and computing, at runtime of the query, a lowest value and a highest value of another segment specified by the segments table, the other segment not being specified by the index table;

identifying data responsive to the query within the decompressed at least one segment using the specified at least one value; and providing an empty set of data responsive to the query if it is determined that there are no groups for which the specified at least one value falls within the corresponding range.

18. A method as in claim 17, wherein the method is implemented by at least one data processor forming part of at least one computing system.

19. A method as in claim 1, wherein the query is a top-k query.

20. A method as in claim 1, wherein the decompression parameters are the lowest value and the highest valued stored in the index table and the decompression parameters define a linear function.

* * * * *